(12) United States Patent
Lim et al.

(10) Patent No.: US 7,271,066 B2
(45) Date of Patent: Sep. 18, 2007

(54) SEMICONDUCTOR DEVICE AND A METHOD OF MANUFACTURING THE SAME

(75) Inventors: Kwan Yong Lim, Soowon-Shi (KR); Heung Jae Cho, Ichon-Shi (KR); Jung Ho Lee, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 105 days.

(21) Appl. No.: 11/086,286

(22) Filed: Mar. 23, 2005

(65) Prior Publication Data

US 2005/0164467 A1     Jul. 28, 2005

Related U.S. Application Data

(62) Division of application No. 10/614,189, filed on Jul. 8, 2003, now Pat. No. 7,081,390.

(30) Foreign Application Priority Data

Dec. 27, 2002    (KR) ............................... 2002-85419

(51) Int. Cl.
*H01L 21/336*     (2006.01)

(52) U.S. Cl. ...................................... 438/269; 438/222
(58) Field of Classification Search ................ 438/199, 438/206, 212, 222, 269, 341, 413, 478, 481, 438/489, 492, 963, 974; 257/501, 506, 513–515, 257/520

See application file for complete search history.

(56) References Cited

U.S. PATENT DOCUMENTS 6,326,281 B1 * 12/2001 Violette et al. ............. 438/413

* cited by examiner

*Primary Examiner*—David Vu
(74) *Attorney, Agent, or Firm*—Lowe Hauptman Ham & Berner LLP

(57) ABSTRACT

Disclosed are a semiconductor devices and method of fabricating the same. Anti-etch films are formed in the top corners of the device isolation film using a material that has a different etch selectivity ratio from nitride or oxide and is not etched in an oxide gate pre-cleaning process. It is thus possible to prevent formation of a moat at the top corners of the device isolation film and the gate oxide film from being thinly formed, thereby improving reliability and electrical characteristics of the device.

8 Claims, 5 Drawing Sheets

SEMICONDUCTOR DEVICE AND A METHOD OF MANUFACTURING THE SAME

This application is a div. of Ser. No. 10/614,189, filling date Jul. 8, 2003, now U.S. Pat. No. 7,081 390.

BACKGROUND OF THE INVENTION

1. Field of the Invention

The present invention relates to a semiconductor device and a method of manufacturing the same, and more particularly, to a semiconductor device and method of fabricating the same, capable of preventing generation of a moat at the top corners of the device isolation film.

2. Background of the Related Art

In all the semiconductor devices, a device isolation film is formed in order to electrically isolate various elements. Conventionally, the device isolation film is formed by means of a LOCOS (local oxidation) process. In this case, however, there are problems that electrical characteristics of the device and the degree of integration are degraded due to a bird's beak occurred at the corner of the device isolation film.

As the degree of integration in the semiconductor devices becomes higher, the device isolation film is formed to have a STI (shallow trench isolation) structure in order to prevent generation of the bird's beak in the device isolation film and also minimize the area occupied by the device isolation film.

In case where the device isolation film is formed to have the STI structure, there is a problem that a moat occurs at the top corners of the device isolation film in the etch process for removing the pad nitride film being the hard mask and in a gate oxide pre-cleaning process.

FIG. 1 is a SEM (scanning electron microscope) photograph illustrating that a moat occurred at the top corners of the device isolation film.

From FIG. 1, it can be seen that the top corners of the device isolation film are etched and the moat is thus formed, in the etch process for removing the pad nitride film being the hard mask and in a gate oxide pre-cleaning process. If the moat is formed at the top corners of the device isolation film as such, etched materials remain at the moat in the process of patterning a conductive material layer in order to form a gate, which causes defects and degrades the electrical characteristics and reliability of the device. Furthermore, as the corner of the active region in the semiconductor substrate in which the semiconductor device is formed is pointed, the gate oxide film is thinly formed at the pointed portion. For this reason, the leakage current is generated and the threshold voltage of the device is changed, at the portion where the gate oxide film is thinly formed, which results in degrading reliability and electrical characteristics of the device.

Furthermore, as the design rule becomes small and the width of the MOSFET device is narrowed, the ratio of the area that the gate oxide film is thinly formed compared to a total area of the active region is relatively increased. Due to this, an electric field is concentrated on the portion where the gate oxide film is thinly formed and a fatal problem such as INWE (inverse-narrow width effect), etc. may thus occur.

SUMMARY OF THE INVENTION

Accordingly, the present invention is contrived to substantially obviate one or more problems due to limitations and disadvantages of the related art.

An object of the present invention is to provide a semiconductor device and method of fabricating the same capable of improving reliability and electrical characteristics of the device by preventing formation of a moat at the top corners of a device isolation film and simultaneously preventing a gate oxide film from being thinly formed, in such a manner that anti-etch films at the top corners of the device isolation film are formed using a material that is not etched in a gate oxide pre-cleaning process and has a different etch selectivity ratio from nitride or oxide.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device according to the present invention is characterized in that it comprises a device isolation film formed on a semiconductor substrate and made of an insulating material layer, an active region layer formed on the semiconductor substrate between the device isolation films, and anti-etch films formed at the top corners of the device isolation film.

In the above, the active region layer consists of a silicon epitaxial growth layer, a silicon-germanium epitaxial growth layer or a stack structure of them.

The anti-etch films are made of a silicate film or a silicon nitride film. The silicate film is made of $AlSi_xO_y$, $HfSi_xO_y$, $YSi_xO_y$, $CeSi_xO_y$ or $TaSi_xO_y$, or a mixture of at least more than one of them. At this time, the composition ratio X is 0.05~10 and the composition ratio Y is 0.05~10.

A high dielectric insulating film may be further provided on the device isolation film in which the anti-etch films are not formed. At this time, the high dielectric insulating film may be formed using $Al_2O_3$, $HfO_2$, $ZrO_2$, $Y_2O_3$, $CeO_2$ or $Ta_2O_5$, or a mixture of at least more than one of them.

A method of fabricating a semiconductor device according to one embodiment of the present invention is characterized in that it comprises the steps of sequentially forming an insulating material layer and an anti-etch film on the entire semiconductor substrate, making the anti-etch film and the insulating material layer remained only in an isolation region through an etch process, thus forming a device isolation film made of an insulating material layer, and forming an active region layer where the semiconductor device will be formed between the device isolation films.

In the above, the anti-etch films may be formed using a silicate film or a silicon nitride film. The silicate film may be formed using $AlSi_xO_y$, $HfSi_xO_y$, $YSi_xO_y$, $CeSi_xO_y$ or $TaSi_xO_y$, or a mixture of at least more than one of them. The composition ratio X may be 0.05~10 and the composition ratio Y may have a value of 0.05~10.

Meanwhile, the method may further comprises the step of before the etch process is implemented after the anti-etch film is formed or before the active region layer is formed after the etch process is performed, implementing an annealing process under an atmosphere of $N_2$, $O_2$, $O_3$, $H_2$, $D_2$, $H_2O$, $D_2O$, NO, $N_2O$ or a mixed gas of them at a temperature of 600~1000° C. for 20 seconds~60 minutes.

A method of fabricating a semiconductor device according to another embodiment of the present invention is characterized in that it comprises the steps of sequentially forming an insulating material layer and a high dielectric insulating film on the entire semiconductor substrate, making the high dielectric insulating film and the insulating material layer remained only in an isolation region through an etch process, thus forming a device isolation film made of an insulating material layer, and excessively growing an active region layer containing silicon on the semiconductor substrate between the device isolation films by means of a selective epitaxial growth process, whereby the active region layer is formed up to the top corner of the high dielectric insulating film, and anti-etch films are formed at the top corners of the device isolation film through reaction of silicon components of the active region layer and the high dielectric insulating film.

In the above, the high dielectric insulating film may be formed using $Al_2O_3$, $HfO_2$, $ZrO_2$, $Y_2O_3$, $CeO_2$, $Ta_2O_5$ or a mixture of them. The anti-etch film is formed using a silicate film.

Meanwhile, the active region layer is formed by means of a selective epitaxial growth process and may be formed by growing a silicon layer, a silicon-germanium layer, or the silicon layer after the silicon-germanium layer is grown. At this time, in the selective epitaxial growth process, $SiH_4$ or $SiH_2Cl_2$ and $Cl_2$ gases may be used as a reaction gas.

The method may further comprised the steps of after the active region layer is formed, removing the active region layer that is formed higher than the device isolation film, by means of a chemical mechanical polishing process, and implementing an annealing process in order to mitigate polishing damage and improve an interfacial characteristic between the device isolation film and the active region layer.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
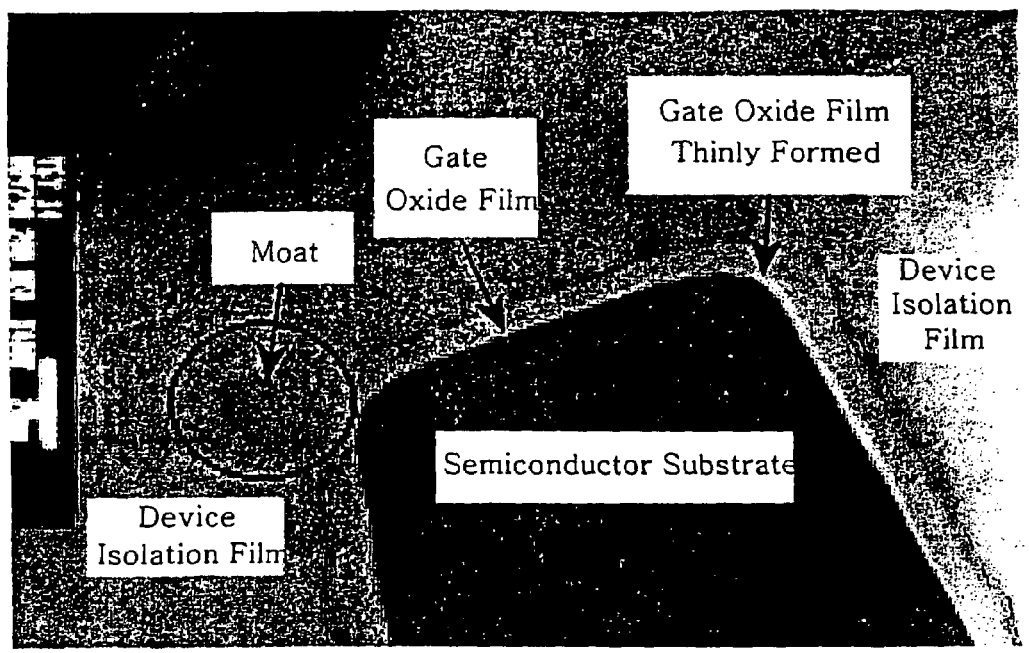
FIG. 1 is a SEM (scanning electron microscope) photograph illustrating that a moat occurred at the top corners of the device isolation film.

Reference will now be made in detail to the preferred embodiments of the present invention, examples of which are illustrated in the accompanying drawings, in which like reference numerals are used to identify the same or similar parts.

Figure 2:
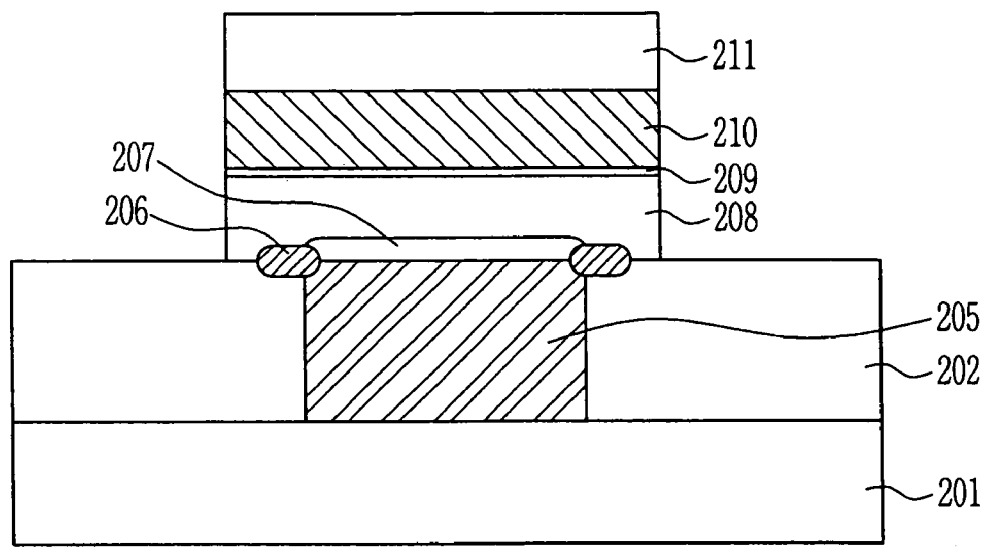
FIG. 2 is a cross-sectional view of a semiconductor device for explaining a device isolation film of the semiconductor device according to a preferred embodiment of the present invention.

FIG. 2 is a cross-sectional view of a semiconductor device for explaining a device isolation film of the semiconductor device according to a preferred embodiment of the present invention.

Referring to FIG. 2, the semiconductor device according to the present invention comprises a device isolation film 202 formed on a semiconductor substrate 201 of an isolation region and consisting of an insulating material layer, an active region layer 205 formed on the semiconductor substrate 201 between the device isolation films 202, and anti-etch films 206 formed at the top corners of the device isolation film 202. A high dielectric insulating film (not shown) may be further provided on the device isolation film 202 in which the anti-etch films 206 are not formed.

Meanwhile, an unexplained reference numeral '207' indicates a gate oxide film formed in the process of fabricating a transistor on the active region layer 205, '208' a polysilicon layer, '209' an anti-diffusion metal layer, '210' a metal layer for forming a silicide layer or an electrode, and '211' a hard mask.

In the above, the active region layer 205 may be formed using a silicon epitaxial growth layer, a silicon-germanium epitaxial growth layer, or a stack-structure of them. Meanwhile, the anti-etch films 206 are formed using a material that has a different etch selectivity ratio from nitride or oxide and is not etched in a gat oxide pre-cleaning process. Preferably, the anti-etch films 206 may be formed using a silicate film made of silicate or a silicon nitride ($Si_3N_4$) film. At this tin, the silicate film may be formed using $AlSi_xO_y$, $HfSi_xO_y$, $YSi_xO_y$, $CeSi_xO_y$ or $TaSi_xO_y$, or a mixture of at least more than one of them. The composition ratio X may have a value of 0.05~10 and Y may have a value of 0.05~10. Furthermore, the high dielectric insulating film formed on the device isolation film 202 may be formed using $Al_2O_3$, $HfO_2$, $ZrO_2$, $Y_2O_3$, $CeO_2$ or $Ta_2O_5$, or a mixture of at least more than one of them.

As the anti-etch films 206 are provided at the top corners of the device isolation film 202, it is possible to prevent the top corners of the device isolation film from being etched in a patterning process for making remained only in the isolation region of the device isolation film 202 or a gate oxide pre-cleaning process for forming the gate oxide film 207. Therefore, it is possible to prevent a moat from being formed at the top corners of the device isolation film 202 and the gate oxide film 207 from being thinly formed at the top corners of the device isolation film 202. Furthermore, as the gate oxide film 207 is prevented from being thinly formed, it is possible to prevent generation of the leakage current.

Meanwhile, a method of fabricating the semiconductor device in which the anti-etch films are provided at the top corners of the device isolation film according to the embodiment of the present invention will be described by reference to the accompanying drawings.

FIG. 3A~FIG. 3E are cross-sectional views of semiconductor devices for explaining a method of forming the device isolation film of the semiconductor device according to a preferred embodiment of the present invention.

Figure 3A:
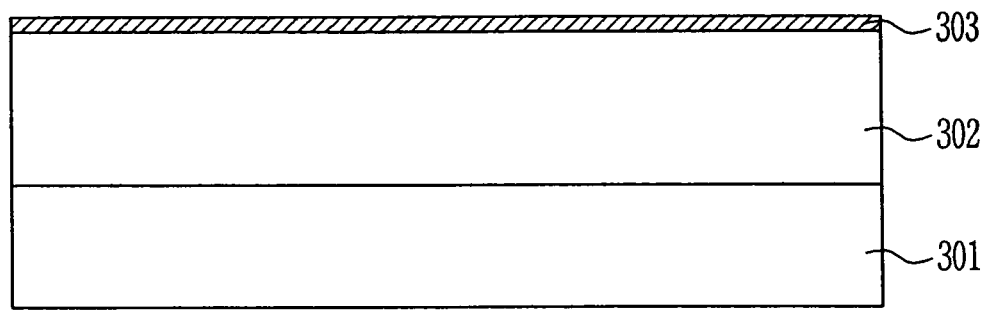
FIG. 3A~FIG. 3E are cross-sectional views of semiconductor devices for explaining a method of forming the device isolation film of the semiconductor devices according to a preferred embodiment of the present invention.

Referring to FIG. 3A, an insulating material layer 302 is formed on the entire semiconductor substrate 301. An anti-etch film 303 is then formed on the insulating material layer 302. At this time, the insulating material layer 302 may be formed using a silicon oxide film. Meanwhile, the anti-etch film 303 is made of a material that has a different etch selectivity ratio from nitride or oxide and is not etched in a gate oxide pre-cleaning process for forming the gate oxide film. Preferably, the anti-etch film 303 may be formed using a silicate film consisting of silicate or a silicon nitride ($Si_3N_4$) film. At this time, the silicate film may be made of $AlSi_xO_y$, $HfSi_xO_y$, $YSi_xO_y$, $CeSi_xO_y$ or $TaSi_xO_y$, or a mixture of at least more than one of them. The composition ratio X may have a value of 0.05~10 and Y may have a value of 0.05~10. After the anti-etch film 303 made of silicate is formed, annealing may be performed under an atmosphere of $N_2$, $O_2$, $O_3$, $H_2$, $D_2$(deuterium), $H_2O$, $D_2O$, NO, $N_2O$ or a mixed gas of them at a temperature of 600~1000° C. for 20 seconds~60 minutes, in order to increase corrosion-resistant against oxide wet-etch.

Figure 3B:
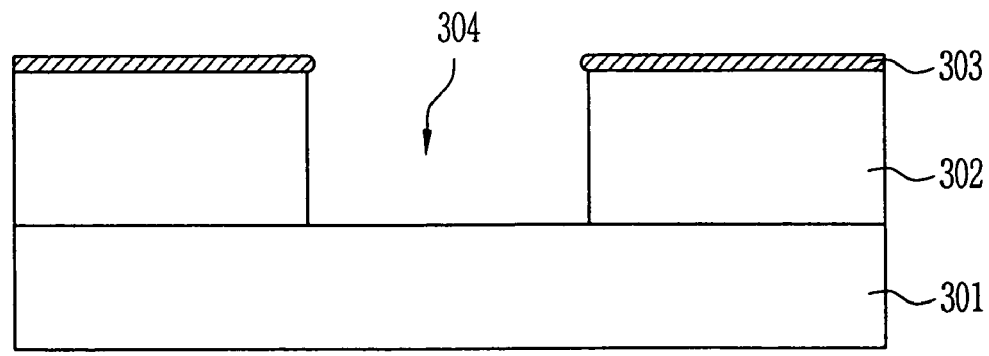

By reference to FIG. 3B, a photoresist pattern (not shown) through which an active region 304 where the semiconductor device will be formed is opened is formed on the anti-etch film 303. The anti-etch film 303 and the insulating material layer 302 in the active region 304 are then removed using the photoresist pattern as an etch mask. Next, the photoresist pattern is removed. Thereby, the insulating material layer remains only on the isolation region. Thus, the device isolation film 302 consisting of the insulating material layer is formed on the semiconductor substrate 301 and the surface of the semiconductor substrate 301 is exposed in the active region 304.

Thereafter, after the insulating material layer of the active region 304 is removed, an annealing process may be performed at a temperature of 700~1100° C. for 5~60 minutes, in order to mitigate etch damage generated on the surface of the device isolation film 302 or the semiconductor substrate 301. At this time, the annealing process may be performed under an atmosphere of $N_2$, $O_2$, $O_3$, $H_2$, $D_2$ (deuterium), $H_2O$, $D_2O$, NO, $N_2O$ or a mixed gas of them.

Figure 3C:
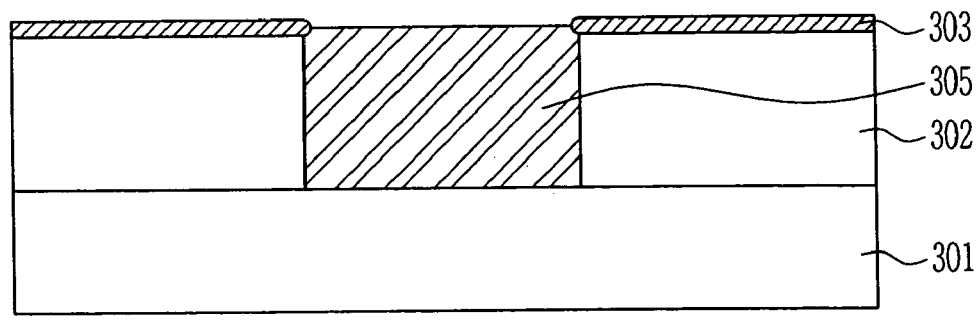

With reference to FIG. 3C, an active region layer 305 is formed in the active region to fill the space between the device isolation films 302 with the active region layer 305. At this time, before the active region 305 is formed, a native oxide film or remnant oxide formed on the surface of the semiconductor substrate 301 in the active region (304 in FIG. 3b) may be first removed.

Meanwhile, the active region layer 305 may be formed using a silicon growth layer that is grown on the semiconductor substrate 301 of the active region by a selective epitaxial growth (SEG) method. The selective epitaxial growth process may employ a $SiH_4$ or $SiH_2Cl_2$ and $Cl_2$ gas as a reaction gas. At this time, when the active region layer 305 is formed by growing silicon through the selective epitaxial growth process, the height of the active region layer 305 may be higher than that of the device isolation film 302 due to excessively grown silicon. In this case, after the active region layer 305 is formed, the excessively grown portion (not shown) of the active region layer 305 is removed and polished through a chemical mechanical polishing process. After the chemical mechanical polishing process is performed, an annealing process is implemented at a temperature of 700~1100° C. for 5~60 minutes in order to mitigate polishing damage and improve an interfacial characteristic between the device isolation film 302 and the active region layer 305. At this time, the annealing process is implemented under an atmosphere of $H_2$, $D_2$, $N_2$ or a mixed gas of them.

Another method for forming the active region layer 305 includes growing a silicon-germanium (epi-SiGe) layer instead of the silicon growth layer to form the active region layer 305, or after the silicon-germanium layer is grown, the silicon layer is regrown to form a channel layer with a strained SiGe channel layer.

In the above, although the chemical mechanical polishing process is implemented, the device isolation film 302 is rarely damaged by the anti-etch film 303.

Figure 3D:
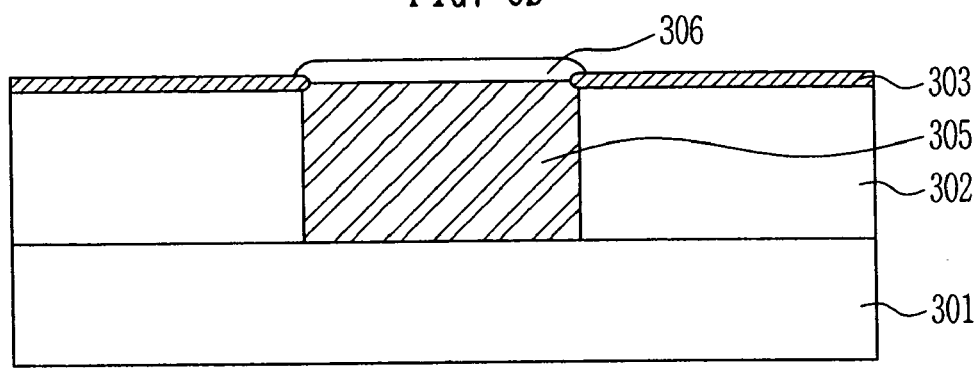

Turning to FIG. 3D, after the surface of the active region layer 305 formed in the active region is cleaned, a gate oxide film 306 is formed. At this time, etch damage does not occur in the device isolation film 302 since it is protected by the anti-etch film 303 even though the cleaning process is performed. Accordingly, a moat does not occur at the top corners of the device isolation film 302. Also, the gate oxide film 306 is not thinly formed at the top corners of the device isolation film 302.

Figure 3E:
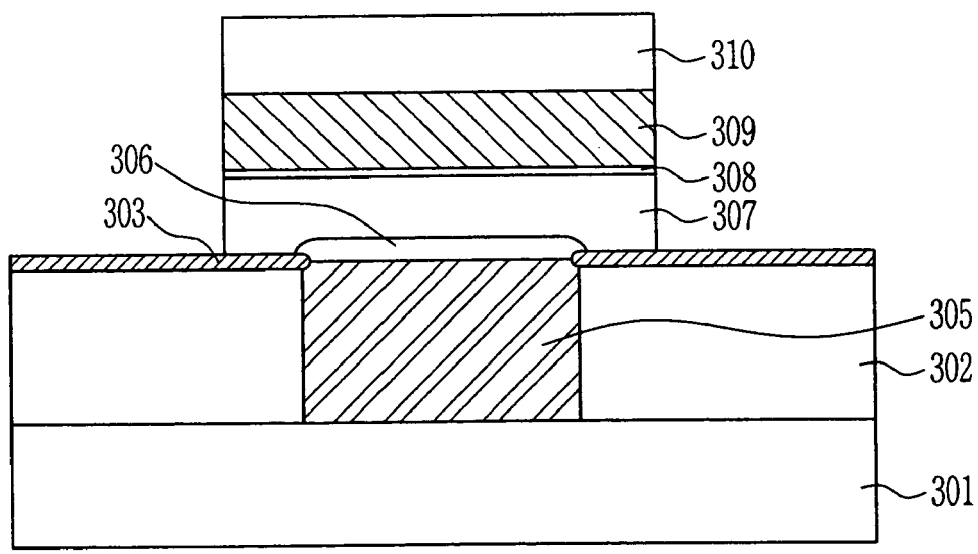

Referring to FIG. 3E, a stack structure of a polysilicon layer 307, an anti-diffusion metal layer 308, a metal layer 309 and a hard mask 310 is formed in a given pattern on the gate oxide film 306 through common processes. Source/drain (not shown) are then formed in the active region layer 305 around the stack structure to form a transistor.

Meanwhile, a method of fabricating the semiconductor device in which the anti-etch film is formed at the top corner of the device isolation film will be now described by reference to the accompanying drawings.

FIG. 4A~FIG. 4F are cross-sectional views of semiconductor devices for explaining a method of forming the device isolation film of the semiconductor device according to another preferred embodiment of the present invention.

Figure 4A:
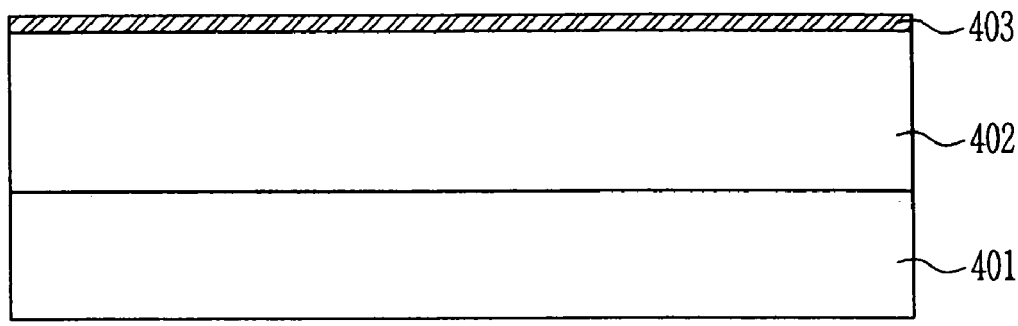
FIG. 4A~FIG. 4F are cross-sectional views of semiconductor devices for explaining a method of forming the device isolation film of the semiconductor devices according to another preferred embodiment of the present invention.

Referring to FIG. 4A, an insulating material layer 402 is formed on the entire semiconductor substrate 401. A high dielectric insulating film 403 is then formed on the insulating material layer 402. At this time, the insulating material layer 402 may be formed using a silicon oxide film. Meanwhile, the high dielectric insulating film 403 is formed using $Al_2O_3$, $HfO_2$, $ZrO_2$, $Y_2O_3$, $CeO_2$, $Ta_2O_5$ or a mixture of them. After the high dielectric insulating film 403 is formed, an annealing process may be performed under an atmosphere of $N_2$, $O_2$, $O_3$, $H_2$, $D_2$ (deuterium), $H_2O$, $D_2O$, NO, $N_2O$ or a mixed gas of them at a temperature of 600~1000° C. for 20 seconds~60 minutes, in order to increase the corrosion-resistant against oxide wet-etch.

Figure 4B:
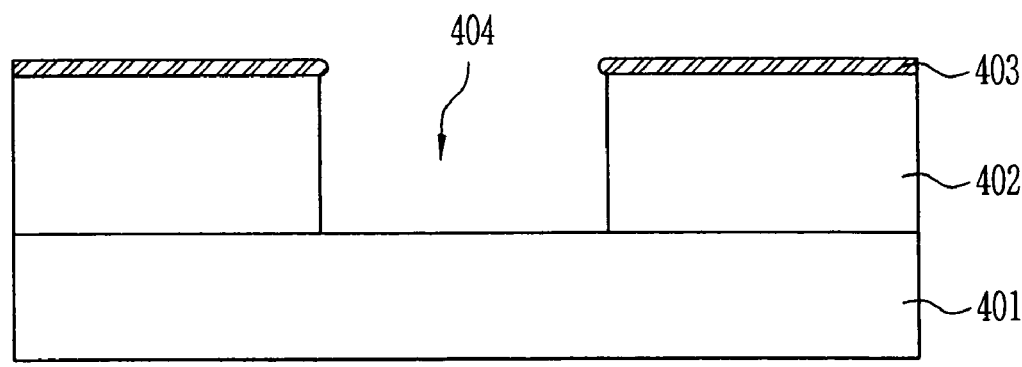

By reference to FIG. 4B, a photoresist pattern (not shown) through which an active region 404 where a semiconductor device will be formed is opened is formed on the high dielectric insulating film 403. The high dielectric insulating film 403 and the insulating material layer 402 in the active region 404 are then removed using the photoresist pattern as an etch mask. Next, the photoresist pattern is removed. Thereby, the insulating material layer remains only in the isolation region. Thus, the device isolation films 402 made of the insulating material layer are formed on the semiconductor substrate 401 and the semiconductor substrate 401 is exposed in the active region 404.

Thereafter, after the insulating material layer of the active region 404 is removed, an annealing process may be performed at a temperature of 700~1100° C. for 5~60 minutes, in order to mitigate etch damage generated on the surface of the device isolation film 402 or the semiconductor substrate 401. At this time, the annealing process may be implemented under an atmosphere of $N_2$, $O_2$, $O_3$, $H_2$, $D_2$ (deuterium), $H_2O$, $D_2O$, NO, $N_2O$ or a mixed gate of them.

Figure 4C:
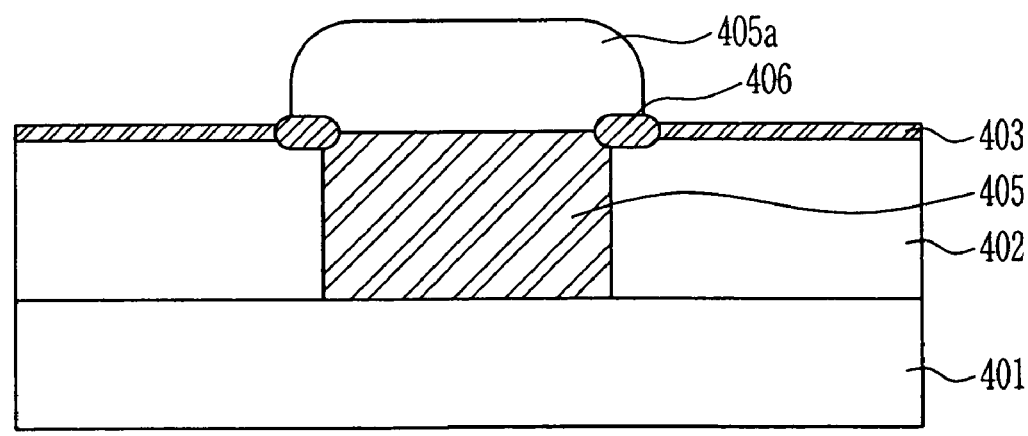

Turning to FIG. 4C, an active region layer 405 is formed in the active region in the same method to that in FIG. 3C, whereby the space between the device isolation films 402 is buried with the active region layer 405. In the same manner, before the active region 405 is formed, a native oxide film or remnant oxide formed on the surface of the semiconductor substrate 401 in the active region (404 in FIG. 4B) may be first removed.

Meanwhile, in the process of forming the active region layer 405 by growing silicon through a selective epitaxial growth process, the silicon layer is excessively grown so that the height of the active region layer 405 is higher than that of the device isolation film 402. As such, if the active region layer 405 is formed to be higher in height than the device isolation film 402, a silicon excessive growth layer 405a is formed up to the top corner of the high dielectric insulating film 403. Due to this, silicon component of the silicon excessive growth layer 405a and the corner of the high dielectric insulating film 403 react, so that the corner of the high dielectric insulating film 403 is changed to silicate. Accordingly, anti-etch films 406 made of silicate are formed at the corners of the device isolation film 402.

Furthermore, in the above, another method for forming the active region layer 405 includes growing a silicon-germanium (Epi-SiGe) layer instead of the silicon growth layer to form the active region layer 405, or after the silicon-germanium layer is formed, growing the silicon layer to form a channel layer using a strained SiGe channel layer.

Figure 4D:
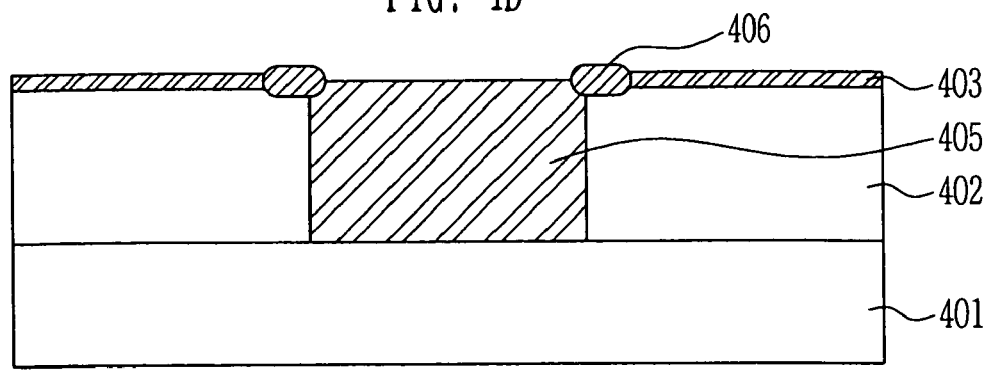

Turning to FIG. 4D, after the anti-etch film 406 is formed, the silicon excessive growth layer (405a in FIG. 4C) is removed and polished through a chemical mechanical polishing process. After the chemical mechanical polishing process is implemented, an annealing process is implemented at a temperature of 700~1100° C. for 5~60 minutes in order to mitigate polishing damage and improve the interfacial characteristic between the device isolation film 402 and the active region layer 405. At this time, the annealing process is performed under an atmosphere of $H_2$, $D_2$, $N_2$ or a mixed gas. In the above, although the chemical mechanical polishing process is performed, damage of the device isolation film 402 by the anti-etch film 403 rarely occurs.

Figure 4E:
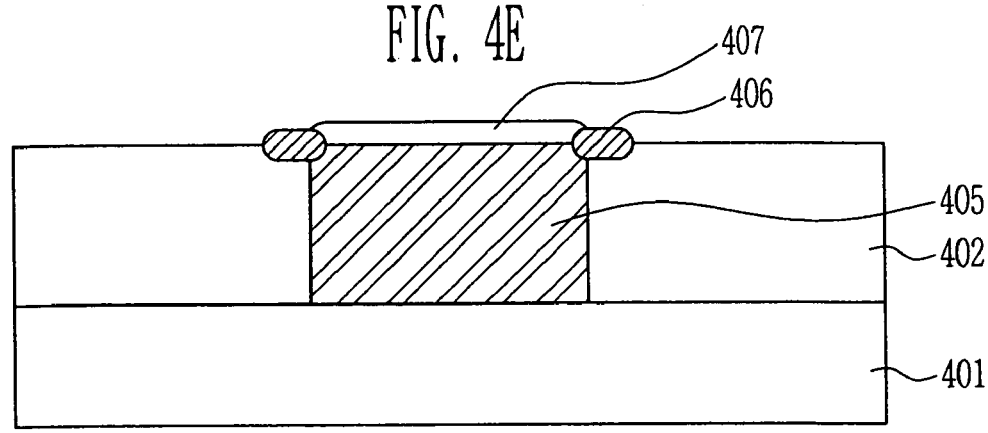

Referring to FIG. 4E, after the surface of the active region layer 405 formed in the active region is cleaned, a gate oxide film 407 is formed. At this time, although the cleaning process is performed, etch damage does not occur in the device isolation film 402 since it is protected by the anti-etch film 406. Therefore, a most does not occur at the top corners of the device isolation film 402. The gate oxide film 407 is not thinly formed at the top corners of the device isolation film 402.

Figure 4F:
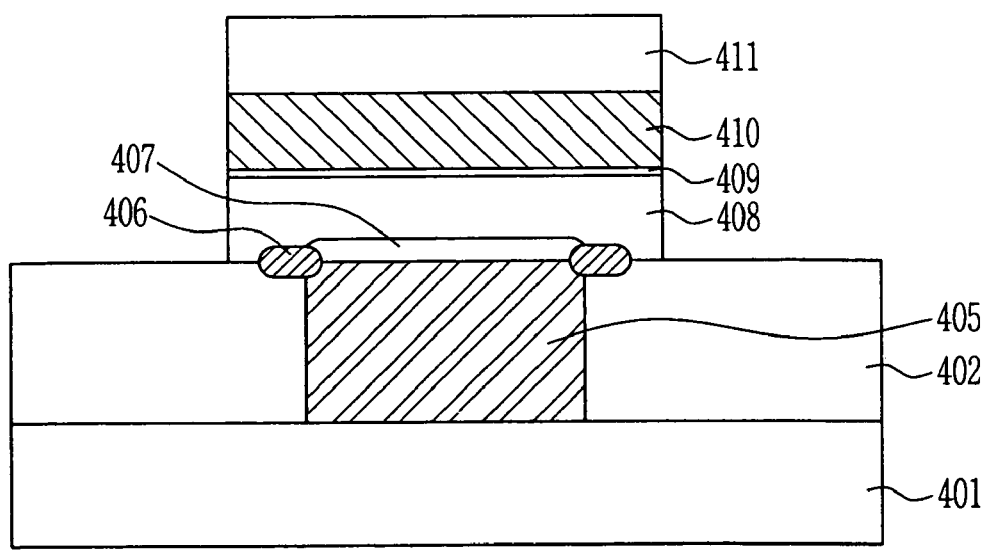

By reference to FIG. 4F, a stack structure of a polysilicon layer 408, an anti-diffusion metal layer 409, a metal layer 410 and a hard mask 411 are formed in a given pattern on the gate oxide film 407 through common processes. Source/drain (not shown) are then formed in the active region layer 405 around the stack structure, thereby completing a transistor.

In the mentioned method of fabricating the semiconductor device according to a preferred embodiment of the present invention could be applied to a process of forming the STI (shallow trench isolation) structure of non-volatile memories and logic devices as well as DRAM devices. Accordingly, the present method could be applied to high-mobility devices using epitaxial silicon-germanium (Epi-SiGe), etc. in addition to epi silicon (epi-Si).

As described above, according to the present invention, anti-etch films are formed in the top corners of the device isolation film. A device isolation film of the STI structure is then formed using a selective epitaxial growth (SEG) process. Accordingly, the present invention has a new effect that it can fundamentally prevent problems that a moat is generated at the top corner of the device isolation film, the gate oxide film is thinly formed and the leakage current is generated, thus improving reliability and electrical characteristics of the device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a semiconductor device using a semiconductor substrate, said method comprising the steps of:

sequentially forming an insulating material layer and an anti-etch film on the entire semiconductor substrate;

performing an annealing process to increase corrosion-resistance against an oxide wet etch after forming the anti-etch film, thereby forming a resultant structure;

etching the resultant structure to allow the anti-etch film and the insulating material layer remaining only in an isolation region, thus forming a device isolation film made of the insulating material layer; and forming an active region layer where the semiconductor device will be formed between the device isolation films.

2. The method as claimed in claim 1, wherein the anti-etch films are made of a silicate film or a silicon nitride film.

3. The method as claimed in claim 2, wherein the silicate film is made of $AlSi_xO_y$, $HfSi_xO_y$, $YSi_xO_y$, $CeSi_xO_y$, or $TaSi_xO_y$, or a mixture of at least more than one of them.

4. The method as claimed in claim 3, wherein the composition ratio X is 0.05~10 and the composition ratio Y is 0.05~10.

5. The method as claimed in claim 1, further comprising the step of implementing an annealing process under an atmosphere of $N_2$, $O_2$, $O_3$, $H_2$, $D_2$, $H_2O$, $D_2O$, NO, $N_2O$ or a mixed gas of them at a temperature of 600~1000° C. f 20 seconds ~60 minutes after forming the active region layer.

6. The method as claimed in claim 1, wherein the active region layer is formed by means of a selective epitaxial growth process and is formed by growing a silicon layer, a silicon-germanium layer, or the silicon layer after the silicon-germanium layer is grown.

7. The method as claimed in claim 6, wherein in the selective epitaxial growth process, $SiH_4$ or $SiH_2Cl_2$ and $Cl_2$ gases are used as a reaction gas.

8. The method as claimed in claim 1, further comprising, after the active region layer is formed, the steps of:

removing the active region layer that is formed higher than the device isolation film, by means of a chemical mechanical polishing process; and implementing an annealing process in order to mitigate polishing damage and improve an interfacial characteristic between the device isolation film and the active region layer.

* * * * *